US007195861B2

(12) United States Patent
Vermeersch et al.

(10) Patent No.: US 7,195,861 B2
(45) Date of Patent: *Mar. 27, 2007

(54) METHOD FOR MAKING A NEGATIVE WORKING, HEAT-SENSITIVE LITHOGRAPHIC PRINTING PLATE PRECURSOR

(75) Inventors: Joan Vermeersch, Deinze (BE); Dirk Kokkelenberg, St. Niklaas (BE); Huub Van Aert, Pulderbos (BE)

(73) Assignee: AGFA-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 11/173,325

(22) Filed: Jun. 30, 2005

(65) Prior Publication Data

US 2006/0019200 A1 Jan. 26, 2006

Related U.S. Application Data

(60) Provisional application No. 60/587,340, filed on Jul. 13, 2004.

(30) Foreign Application Priority Data

Jul. 8, 2004 (EP) .................................. 04103245

(51) Int. Cl.
*G03F 7/16* (2006.01)
*G03F 7/105* (2006.01)

(52) U.S. Cl. ................ 430/302; 430/270.1; 430/281.1; 430/286.1; 430/288.1

(58) Field of Classification Search ................ 430/138, 430/270.1, 281.1, 286.1, 302, 434, 435, 494, 430/944, 945; 40/288.1; 403/309
See application file for complete search history.

(56) References Cited

U.S. PATENT DOCUMENTS

| | | | |
|---|---|---|---|
| 3,476,937 | A | 11/1969 | Gevaert |
| 3,971,660 | A | 7/1976 | Staehle |
| 4,045,232 | A | 8/1977 | Parkinson |
| 4,284,705 | A | 8/1981 | Philpot et al. |
| 4,458,005 | A | 7/1984 | Mohr et al. |
| 4,840,713 | A | 6/1989 | Pliefke |
| 4,897,168 | A | 1/1990 | Boergerding et al. |
| 4,981,517 | A | 1/1991 | DeSanto, Jr. et al. |
| 5,026,677 | A | 6/1991 | Vanmaele |
| 5,156,723 | A | 10/1992 | Pliefke et al. |
| 5,314,787 | A | 5/1994 | Elsaesser et al. |
| 5,556,531 | A | 9/1996 | Wiedemann |
| 5,637,441 | A | 6/1997 | Brenk et al. |
| 5,716,743 | A | 2/1998 | Stein et al. |
| 5,930,547 | A | 7/1999 | Stein et al. |
| 5,948,591 | A | 9/1999 | Vermeersch et al. |
| 6,140,392 | A | 10/2000 | Kingman et al. |
| 6,420,083 | B1 * | 7/2002 | Kawamura ............... 430/270.1 |
| 6,427,595 | B1 | 8/2002 | Van Damme et al. |
| 6,492,093 | B2 | 12/2002 | Gaschler et al. |
| 6,692,890 | B2 | 2/2004 | Huang et al. |
| 2002/0006575 | A1 | 1/2002 | Gaschler et al. |
| 2006/0014103 | A1 * | 1/2006 | Vermeersch et al. ........ 430/300 |
| 2006/0019200 | A1 * | 1/2006 | Vermeersch et al. ........ 430/302 |

FOREIGN PATENT DOCUMENTS

| | | | |
|---|---|---|---|
| DE | 1 447 963 | | 11/1968 |
| DE | 40 01 466 | A1 | 7/1991 |
| DE | 44 17 907 | A1 | 11/1995 |
| DE | 44 23 140 | A1 | 1/1996 |
| EP | 0 291 760 | A2 | 11/1988 |
| EP | 0 292 801 | A2 | 11/1988 |
| EP | 0 400 706 | A1 | 12/1990 |
| EP | 0 514 145 | A1 | 11/1992 |
| EP | 0 537 633 | A1 | 4/1993 |
| EP | 0 556 690 | A1 | 8/1993 |
| EP | 0 599 510 | A2 | 6/1994 |
| EP | 0 601 240 | A1 | 6/1994 |
| EP | 0 625 728 | A2 | 11/1994 |
| EP | 0 659 909 | A1 | 6/1995 |
| EP | 0 770 497 | A1 | 10/1995 |
| EP | 0 770 494 | A2 | 5/1997 |
| EP | 0 770 495 | A1 | 5/1997 |
| EP | 0 770 496 | A1 | 5/1997 |
| EP | 0 800 928 | A1 | 10/1997 |

(Continued)

OTHER PUBLICATIONS

Duke et al.; *Calibration of Spherical Particles by Light Scattering*; pp. 223-238 (1989).

(Continued)

*Primary Examiner*—Barbara L. Gilliam
(74) *Attorney, Agent, or Firm*—Leydig, Voit & Mayer, Ltd.

(57) ABSTRACT

A method for making a heat-sensitive negative-working lithographic printing plate precursor is disclosed comprising the steps of (i) preparing a coating solution comprising hydrophobic thermoplastic polymer particles and a hydrophilic binder;
(ii) applying said coating solution on a support having a hydrophilic surface or which is provided with a hydrophilic layer, thereby obtaining an image-recording layer;
(iii) drying said image-recording layer;

characterized in that said hydrophobic thermoplastic polymer particles have an average particle size in the range from 45 nm to 63 nm, and that the amount of said hydrophobic thermoplastic polymer particles in the image-recording layer is at least 70% by weight relative to the dried image-recording layer.

17 Claims, No Drawings

FOREIGN PATENT DOCUMENTS

| | | | |
|---|---|---|---|
| EP | 816 070 | A1 * | 1/1998 |
| EP | 0 823 327 | A2 | 2/1998 |
| EP | 0 864 420 | A1 | 9/1998 |
| EP | 0 894 622 | A2 | 2/1999 |
| EP | 0 901 902 | A2 | 3/1999 |
| EP | 0 978 376 | A2 | 2/2000 |
| EP | 1 029 667 | A1 | 8/2000 |
| EP | 1 053 868 | A1 | 8/2000 |
| EP | 1 093 934 | A1 | 4/2001 |
| EP | 1 217 010 | A1 | 6/2002 |
| EP | 1 219 416 | A1 | 7/2002 |
| EP | 1 243 413 | A1 | 9/2002 |
| FR | 23 00 354 | | 9/1976 |
| GB | 1 084 070 | | 9/1967 |
| GB | 1 154 749 | | 6/1969 |
| GB | 1 419 512 | | 12/1975 |
| WO | WO 97/39894 | A1 | 10/1997 |
| WO | WO 00/29214 | A1 | 5/2000 |
| WO | WO 00/32705 | A1 | 6/2000 |

OTHER PUBLICATIONS

Stober; *J. Colloid and Interface Sci.*; vol. 26; pp. 62-69; (1968).

* cited by examiner

METHOD FOR MAKING A NEGATIVE WORKING, HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/587,340 filed Jul. 13, 2004, which is incorporated by reference. In addition, this application claims the benefit of European Application No. 04103245.9 filed Jul. 08, 2004, which is also incorporated by reference.

FIELD OF THE INVENTION

The present invention relates to a method for making a heat-sensitive, negative working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by crosslinking of a polymer, heat-induced solubilization, or by particle coagulation of a thermoplastic polymer latex.

Although some of these thermal processes enable plate making without wet processing, the most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-A 625,728.

Negative working plate precursors which do not require a pre-heat step may contain an image-recording layer that works by heat-induced particle coalescence of a thermoplastic polymer latex, as described in e.g. EP-As 770 494, 770 495, 770 496 and 770 497. These patents disclose a method for making a lithographic printing plate comprising the steps of (1) image-wise exposing an imaging element comprising hydrophobic thermoplastic polymer particles dispersed in a hydrophilic binder and a compound capable of converting light into heat, (2) and developing the image-wise exposed element by applying fountain and/or ink.

Another plate that works by latex coalescence is described in EP-A 800,928 which discloses a heat-sensitive imaging element comprising on a hydrophilic support an image-recording layer comprising an infrared absorbing compound and hydrophobic thermoplastic particles dispersed in an alkali soluble or swellable resin which contains phenolic hydroxyl groups.

A similar plate is described in U.S. Pat. No. 6,427,595 which discloses a heat-sensitive imaging element for making lithographic printing plates comprising on a hydrophilic surface of a lithographic base an image-recording layer comprising a compound capable of converting light into heat and hydrophobic thermoplastic polymer particles, which have a specific particle size and polydispersity, dispersed in a hydrophilic binder.

EP-A 514,145 and EP-A 599,510 disclose a method for forming images by direct exposure of a radiation sensitive plate comprising a coating comprising core-shell particles having a water insoluble heat softenable core compound and a shell compound which is soluble or swellable in an aqueous alkaline medium. Image-wise exposing with infrared light causes the particles to coalesce, at least partially, to form an image, and the non-coalesced particles are then selectively removed by means of an aqueous alkaline developer. Afterwards, a baking step is performed.

U.S. Pat. No. 6,692,890 discloses a radiation-imageable element comprising a hydrophilic anodized aluminium base with a surface comprising pores and an image forming layer comprising polymer particles coated on the base wherein the ratio of said pores to the average diameter of the polymer particles ranges from about 0.4:1 to 10:1.

EP-A 1,243,413 discloses a method for making a negative-working heat-sensitive lithographic printing plate precursor comprising the steps of (i) applying on a lithographic base having a hydrophilic surface an aqueous dispersion comprising hydrophobic thermoplastic particles and particles of a polymer B which have a softening point lower than the glass transition temperature of said hydrophobic thermoplastic particles and (ii) heating the image-recording layer at a temperature which is higher than the softening point of polymer B and lower than the glass temperature of the hydrophobic thermoplastic particles.

U.S. Pat. No. 5,948,591 discloses a heat sensitive element for making a lithographic printing plate comprising on a base having a hydrophilic surface an image-recording layer including an infrared absorbing agent, hydrophobic thermoplastic particles and a copolymer containing acetal groups and hydroxyl groups which have at least partially reacted with a compound with at least two carboxyl groups.

A problem associated with negative-working printing plates that work according to the mechanism of heat-induced latex coalescence, is to provide both a high run-length during printing and a high sensitivity during exposure. A high run-length can be obtained by exposing the printing plate with a high heat (infrared light) dose—i.e. a high energy density—so that the latex particles in the exposed areas coalesce to a high extent, adhere firmly to the support and are thereby rendered resistant to the development where the non-exposed areas are removed from the support. However, the use of a high energy dose implies a low speed plate which requires a long exposure time and/or a high power laser. When on the other hand a low heat dose is applied, the extent of coalescence is low and the exposed areas degrade rapidly during the press run and as a result, a low run-length is obtained.

SUMMARY OF THE INVENTION

It is an object of the present invention to provide a method for making a negative-working, heat-sensitive lithographic printing plate precursor based on latex coalescence which has a high sensitivity and which results in a printing plate with an improved run-length on the press and excellent printing properties without toning.

This object is realized by a method for making a heat-sensitive negative-working, lithographic printing plate precursor comprising the steps of:

(i) preparing a coating solution comprising hydrophobic thermoplastic polymer particles and a hydrophilic binder;

(ii) applying said coating solution on a support having a hydrophilic surface or which is provided with a hydrophilic layer, thereby obtaining an image-recording layer;

(iii) drying said image-recording layer;

characterized in that said hydrophobic thermoplastic polymer particles have an average particle size in the range from 45 nm to 63 nm, and that the amount of said hydrophobic thermoplastic polymer particles in the image-recording layer is at least 70% by weight relative to the dried image-recording layer.

Preferred embodiments of the present invention are defined in the dependent claims.

It was surprisingly found that a printing plate precursor comprising latex particles with an average particle size ranging from 45 nm to 63 nm in an amount of at least 70% by weight, provides a printing plate with a substantially increased press life and an improved sensitivity. Furthermore, the printing plate used in the present invention provides prints with an excellent image quality and no toning.

DETAILED DESCRIPTION OF THE INVENTION

The hydrophobic thermoplastic particles are present in an image-recording layer of the coating of the lithographic printing plate precursor used in the present invention. The average particle size is comprised between 45 nm and 63 nm, more preferably between 45 nm and 60 nm, more preferably between 45 nm and 59 nm, even more preferably between 45 nm and 55 nm and most preferably between 48 nm and 52 nm. Herein, the particle size is defined as the particle diameter, measured by Photon Correlation Spectrometry, also known as Quasi-Elastic or Dynamic Light-Scattering. This technique is a convenient method for measuring the particle size and the values of the measured particle size match well with the particle size measured with transmission electronic microscopy (TEM) as disclosed by Stanley D. Duke et al. in Calibration of Spherical Particles by Light Scattering, in Technical Note-002B, May 15, 2000 (revised Jan. 3, 2000 from a paper published in Particulate Science and Technology 7, p. 223–228 (1989).

The amount of hydrophobic thermoplastic polymer particles present in the image-recording layer of the coating is at least 70% by weight, preferably at least 75% by weight and more preferably at least 80% by weight. The amount of hydrophobic thermoplastic polymer particles in the image-recording layer of the coating is preferably between 70% by weight and 85% by weight and more preferably between 75% by weight and 85% by weight. The weight percentage of the hydrophobic thermoplastic polymer particles is determined relative to the weight of all the components in the image-recording layer.

The hydrophobic thermoplastic polymer particles are preferably selected from polyethylene, poly(vinyl)chloride, polymethyl(meth)acrylate, polyethyl (meth)acrylate, poyvinylidene chloride, poly(meth)acrylonitrile, polyvinylcarbazole, polystyrene or copolymers thereof. According to a preferred embodiment, the thermoplastic polymer particles comprise polystyrene or derivatives thereof, mixtures comprising polystyrene and poly(meth)acrylonitrile or derivatives thereof, or copolymers comprising polystyrene and poly(meth)acrylonitrile or derivatives thereof. The latter copolymers may comprise at least 50% by weight of polystyrene, and more preferably at least 65% by weight of polystyrene. In order to obtain sufficient resistivity towards organic chemicals such as hydrocarbons used in plate cleaners, the thermoplastic polymer particles preferably comprise at least 5% by weight of nitrogen containing units as described in EP 1,219,416, more preferably at least 30% by weight of nitrogen containing units, such as (meth)acrylonitrile. According to the most preferred embodiment, the thermoplastic polymer particles consist essentially of styrene and acrylonitrile units in a weight ratio between 1:1 and 5:1 (styrene:acrylonitrile), e.g. in a 2:1 ratio.

The weight average molecular weight of the thermoplastic polymer particles may range from 5,000 to 1,000,000 g/mol.

The hydrophobic thermoplastic polymer particles present in the image-recording layer can be applied onto the lithographic base in the form of a dispersion in an aqueous coating liquid and may be prepared by the methods disclosed in U.S. Pat. No. 3,476,937 or EP 1,217,010. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The image-recording layer further comprises a hydrophilic binder which is preferably soluble in an aqueous developer having a pH≧10. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate and maleic anhydride/vinylmethylether copolymers.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminium support, both the adhesion of the printing image and the wetting characteristics of the non-image areas are improved. By varying the type and/or concentration of the electrolyte and the applied voltage in the graining step, different type of grains can be obtained.

By anodising the aluminium support, its abrasion resistance and hydrophilic nature are improved. The microstructure as well as the thickness of the $Al_2O_3$ layer are determined by the anodising step, the anodic weight (g/m$^2$ $Al_2O_3$ formed on the aluminium surface) varies between 1 and 8 g/m$^2$.

The grained and anodized aluminum support may be post-treated to improve the hydrophilic properties of its surface. For example, the aluminum oxide surface may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydrocarboxylic acids, sulphonic acids or phosphonic acids, or their salts, e.g. succinates, phosphates, phosphonates, sulphates, and sulphonates. A citric acid or citrate solution is preferred. This treatment may be carried out at room temperature or may be carried out at a slightly elevated temperature of about 30° C. to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight. The amount of hardening agent, in particular tetra-alkyl orthosilicate, is preferably at least 0.2 parts per part by weight of hydrophilic binder, more preferably between 0.5 and 5 parts by weight, most preferably between 1 parts and 3 parts by weight.

According to another embodiment the base layer may also comprise $Al_2O_3$ and an optional binder. Deposition methods for the $Al_2O_3$ onto the flexible support may be (i) physical vapor deposition including reactive sputtering, RF-sputtering, pulsed laser PVD and evaporation of aluminium, (ii) chemical vapor deposition under both vacuum and non-vacuum condition, (iii) chemical solution deposition including spray coating, dipcoating, spincoating, chemical bath deposition, selective ion layer adsorption and reaction, liquid phase deposition and electroless deposition. The $Al_2O_3$ powder can be prepared using different techniques including flame pyrolisis, ball milling, precipitation, hydrothermal synthesis, aerosol synthesis, emulsion synthesis, sol-gel synthesis (solvent based), solution-gel synthesis (water based) and gas phase synthesis. The particle size of the $Al_2O_3$ powders can vary between 2 nm and 30 μm; more preferably between 100 nm and 2 μm.

The hydrophilic base layer may also contain substances that increase the mechanical strength and the porosity of the layer. For this purpose colloidal silica may be used. The colloidal silica employed may be in the form of any commercially available water dispersion of colloidal silica for example having a particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides.

Particular examples of suitable hydrophilic base layers for use in accordance with the present invention are disclosed in EP 601240, GB 1419512, FR 2300354, U.S. Pat. No. 3,971,660, and U.S. Pat. No. 4,284,705.

An optimal ratio between pore diameter of the surface of the aluminium support (if present) and the average particle size of the hydrophobic thermoplastic particles may enhance the press life of the printing plate and may improve the toning behaviour of the prints. This ratio of the average pore diameter of the surface of the aluminium support to the average particle size of the thermoplastic particles present in the image-recording layer of the coating, preferably ranges from 0.05:1 to 0.8:1, more preferably from 0.10:1 to 0.35:1.

The coating preferably also contains a compound which absorbs infrared light and converts the absorbed energy into heat. The amount of infrared absorbing agent in the coating is preferably between 0.25 and 25.0% by weight, more preferably between 0.5 and 20.0% by weight. The infrared absorbing compound can be present in the image-recording layer and/or an optional other layer. In the embodiment the infrared absorbing agent is present in the image-recording layer of the coating, its concentration is preferably at least 6% by weight, more preferably at least 8% by weight, relative to the weight of all the components in the image-recording layer. Preferred IR absorbing compounds are dyes such as cyanine, merocyanine, indoaniline, oxonol, pyrilium and squarilium dyes or pigments such as carbon black. Examples of suitable IR absorbers are described in e.g.

EP-As 823327, 978376, 1029667, 1053868, 1093934; WO 97/39894 and 00/29214. A preferred compound is the following cyanine dye IR-1:

IR-1

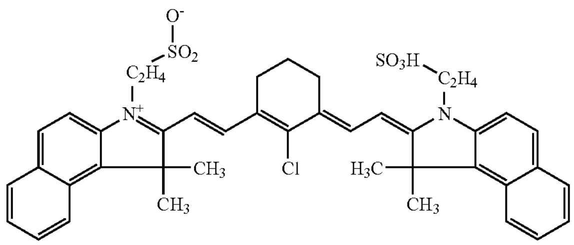

To protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

The coating may in addition to the image-recording layer also contain one or more additional layer(s). Besides the additional layers already discussed above—i.e. an optional light-absorbing layer comprising one or more compounds that are capable of converting infrared light into heat and/or a protective layer such as e.g. a covering layer which is removed during processing—the coating may further for example comprise an adhesion-improving layer between the image-recording layer and the support.

Optionally, the coating may further contain additional ingredients. These ingredients may be present in the image-recording layer or in on optional other layer. For example, additional binders, polymer particles such as matting agents and spacers, surfactants such as perfluoro surfactants, silicon or titanium dioxide particles, development inhibitors, development accelerators or colorants are well-known components of lithographic coatings. Especially addition of colorants such as dyes or pigments which provide a visible color to the coating and remain in the exposed areas of the coating after the processing step, are advantageous. Thus, the image-areas which are not removed during the processing step form a visible image on the printing plate and examination of the developed printing plate already at this stage becomes feasible. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in the detailed description of EP-A 400,706 are suitable contrast dyes. Dyes which, combined with specific additives, only slightly color the coating but which become intensively colored after exposure, are also of interest.

According to the method of the present invention first a coating solution comprising the above described hydrophobic thermoplastic polymer particles and hydrophilic binder is prepared, said coating solution is than applied on a support (as descibed above) thereby obtaining an image-recording layer, and than said image-recording layer is dried.

The printing plate precursor used in the present invention can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor used in the present invention is preferably not sensitive to visible light. Most preferably, the coating is not sensitive to ambient daylight, i.e. visible (400–750 nm) and near UV light (300–400 nm) at an intensity and exposure time corresponding to normal working conditions so that the material can be handled without the need for a safe light environment.

The printing plate precursors used in the present invention can be exposed to infrared light by means of e.g. LEDs or an infrared laser. Preferably, the light used for the exposure is a laser emitting near infrared light having a wavelength in the range from about 700 to about 1500 nm, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N. V.) is a typical example of a plate-setter using the ITD-technology. XTD plate-setters for thermal plates having a typical laser power from about 20 mW to about 500 mW operate at a lower scan speed, e.g. from 0.1 to 20 m/sec. The Creo Trendsetter plate-setter family (trademark of Creo) and the Agfa Xcalibur plate-setter family (trademark of Agfa Gevaert N. V.) both make use of the XTD-technology.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

After exposure, the material can be developed by supplying to the coating an aqueous alkaline solution whereby the non-image areas of the coating are removed. This developing step with an aqueous alkaline developer solution may be combined with mechanical rubbing, e.g. by a rotating brush. During the development step, any water-soluble protective layer present is preferably also removed. A preferred developer solution is a developer with a pH of at least 10, more preferably at least 11, most preferably at least 12. Preferred developer solutions are buffer solutions such as for example silicate-based developers or developer solutions comprising phosphate buffers. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution comprising sodium or potassium metasilicate, i.e. a silicate where the ratio of silicon dioxide to alkali metal oxide is 1.

In addition to alkali metal silicates, the developer may optionally contain further components, such as buffer substances, complexing agents, antifoams, organic solvents in small amounts, corrosion inhibitors, dyes, surfactants and/or hydrotropic agents as known in the art.

The development is preferably carried out at temperatures from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of plate precursor. The addition of replenisher can be regulated, for example, by measuring the conductivity of the developer as described in EP-A 0,556,690.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the thermoplastic particles, e.g. between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

Example 1

Preparation of the Lithographic Substrate.

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained during 15 seconds using an alternating current in an aqueous solution containing 12 g/l of hydrochloric acid and 38 g/l of aluminum sulfate (18-hydrate) at a temperature of 33° C. and a current density of 130 $A/dm^2$. After rinsing with demineralized water for 2 seconds, the aluminum foil was then desmutted by etching with an aqueous solution containing 155 g/l of sulfuric acid at 70° C. for 4 seconds and rinsed with demineralized water at 25° C. for 2 seconds. The foil was subsequently subjected to anodic oxidation during 13 seconds in an aqueous solution containing 155 g/l of sulfuric acid at a temperature of 45° C. and a current density of 22 $A/dm^2$, then washed with demineralized water for 2 seconds and post-treated for 10 seconds with a solution containing 4 g/l of polyvinylphosphonic acid at 40° C., rinsed with demineralized water at 20° C. during 2 seconds and dried.

The support thus obtained has a surface roughness Ra of 0.21 μm and an anodic weight of 4 $g/m^2$ of $Al_2O_3$.

Preparation of the Printing Plate Precursors 1–6.

Printing plate precursors 1 to 6 were produced by applying a coating solution onto the above described lithographic substrate. The composition of the coating is defined in Table 1. The average particle sizes of the styrene/acrylonitrile copolymers were measured with a Brookhaven BI-90 analyzer, commercially available from Brookhaven Instrument Company, Holtsville, N.Y., USA, and are indicated in Table 2. The coating was applied from an aqueous coating solution and a dry coating weight of 0.84 g/m was obtained.

TABLE 1 composition of the dry coating (% wt)

| INGREDIENTS | % wt |
|---|---|
| Styrene/acrylonitrile copolymer (1) | 83 |
| Triethylammonium salt of IR-1 (2) | 8 |
| Polyacrylic acid binder (3) | 6 |
| Cab O Jet 200 (4) | 3 |

(1) weight ratio 60/40, stabilized with an anionic wetting agent; average particle size as defined in Table 2;
(2) Infrared absorbing dye IR-1 as defined above;
(3) Aquatreat AR-7H from National Starch & chemical company, Mw = 500 000 g/mol;
(4) Carbon dispersion in water from Cabot.

Imaging and Processing of the Printing Plate Precursors 1–6.

The plate precursors 1–6 were exposed with a Creo Trendsetter 2344T (40 W) (plate-setter, trademark from Creo, Burnaby, Canada), operating at 200 $mJ/cm^2$ and 150 rpm.

After imaging, the plate precursors were processed in an Agfa VA88 processor (trademark from Agfa), operating at a speed of 1 m/min and at 22° C., using Agfa PD91 (trademark from Agfa) as developer solution (silicate based).

PD91 is a buffer solution comprising potassium metasilicate, Genapol C200 (surfactant commercially available from Clariant GmbH, Frankfurt am Main Germany) and Libraterić AA30 (surfactant commercially available from Libra Chemicals Limited, Manchester UK) and has a pH=13.

After development, the plates are gummed with RC795 (trademark from Agfa).

Print Results.

The plates were mounted on a GTO46 printing press (available from Heidelberger Druckmaschinen AG), and a print job was started using K+E Novavit 800 Skinnex ink (trademark of BASF Drucksysteme GmbH) and 3% FS101 (trademark of Agfa) in 10% isopropanol as a fountain liquid.

The lithographic properties of the plates were determined by visual inspection of the appearance of toning in the non-image areas of the plates and the quality of the coating was determined in terms of run-length (Table 2). An excellent run length resistance (++) means that after 100,000 prints the 1% highlight of a 200 lpi screen was still rendered on the print and a good run length resistance (+) means that after 100,000 prints the 2% highlight of a 200 lpi screen was still rendered on the print. An insufficient run length resistance (–) means that after 1,000 prints breakdown of the highlight of a 200 lpi screen occured.

TABLE 2 results of run-length and appearance of toning in the non-image areas of the plate.

| | Average particle size nm | Toning behaviour | Run length* |
|---|---|---|---|
| Plate 1 (Precursor 1) Comp. Ex. | 36 | Toning | Not relevant due to toning |
| Plate 2 (Precursor 2) Inv. Ex. | 45 | slight toning tendency | ++ |
| Plate 3 (Precursor 3) Inv. Ex. | 50 | No toning | ++ |
| Plate 4 (Precursor 4) Inv. Ex. | 61 | No toning | + |
| Plate 5 (Precursor 5) Comp. Ex. | 77 | No toning | – |
| Plate 6 (Precursor 6) Comp. Ex. | 83 | No toning | – |

*++ indicates that after 100,000 prints the 1% highlight of a 200 lpi screen was still rendered on the print;
+ indicates that after 100,000 prints the 2% highlight of a 200 lpi screen was still rendered on the print;
– indicates that already after 1000 prints breakdown of the highlight of a 200 lpi screen occurred.

The results in Table 2 demonstrate that the plates comprising a latex with an average particle size below 45 nm shows toning on the non-printing areas of the plate, and plates comprising a latex with an average particle size of 77 nm or higher have a reduced run length. The plates comprising a latex with an average particle size of 45 nm shows only a slight tendency of toning and no toning is observed for plates with particles of 50 nm or 61 nm.

Example 2

Preparation of the Lithographic Substrate.

The preparation of the lithographic substrate was done according to Example 1.

Preparation of the Printing Plate Precursors 7–10.

The printing plate precursors 7 to 10 were produced by applying a coating onto the above described lithographic substrate. The composition of the coating is defined in Table 3. The average particle sizes of the styrene/acrylonitrile copolymers were measured with a Brookhaven BI-90 analyzer, commercially available from Brookhaven Instrument Company, Holtsville, N.Y., USA, and are indicated in Table 4. The coating was applied from an aqueous coating solution and a dry coating weight of 0.84 g/m$^2$ was obtained.

TABLE 3 composition of the dry coating(% wt)

| INGREDIENTS | % wt |
|---|---|
| Styrene/acrylonitrile copolymer (1) | 83 |
| Triethylammonium salt of IR-1 (2) | 8 |
| Polyacrylic acid binder (3) | 6 |
| Cab O Jet 250 (4) | 3 |

(1) weight ratio 60/40, stabilized with an anionic wetting agent; average particle size as defined in Table 4;
(2) infrared absorbing dye IR-1 as defined above;
(3) Aquatreat AR-7H from National Starch & chemical company, Mw = 500 000 g/mol;
(4) Copper phtalocyanine dispersion in water from Cabot.

Imaging and Processing of the Printing Plate Precursors 7–10.

The plate precursors 7–10 were exposed with a Creo Trendsetter 2344T (40 W) (plate-setter available from Creo, Burnaby, Canada), operating at 150 rpm and varying energy densities up to 250 mJ/cm$^2$.

After imaging, the plates were processed in an Agfa VA88 processor, operating at a speed of 1 m/min and at 25° C., and using Agfa PD91 (trademark from Agfa) as developer solution (silicate based).

PD91 is a buffer solution comprising potassium metasilicate, Genapol C200 (surfactant commercially available from Clariant GmbH, Frankfurt am Main Germany) and Librateric AA30 (surfactant commercially available from Libra Chemicals Limited, Manchester UK) and has a pH=13.

After development, the plates are gummed with RC795 (trademark from Agfa).

Print Results.

The plates were mounted on a GTO46 printing press (available from Heidelberger Druckmaschinen AG) and a print job was started using K+E Novavit 800 Skinnex ink (trademark of BASF Drucksysteme GmbH) and 4% Combifix XL with 10% isopropanol as a fountain liquid.

The sensitivity of the plate precursors was determined and is summarized in Table 4.

TABLE 4

Sensitivity of plates 7–10

| | Average particle size Nm | Sensitivity(*) mJ/cm$^2$ |
|---|---|---|
| Plate 7 (Precursor 7) Comp. Ex. | 41 | Flocculation(**) |
| Plate 8 (Precursor 8) Inv. Ex. | 51 | 175 |
| Plate 9 (Precursor 9) Inv. Ex. | 63 | 200 |
| Plate 10 (Precursor 10) Comp. Ex. | 79 | >>250 |

(*)energy at which 2% dot is clearly reproduced on print
(**)gelation due to strong interaction of binder and small particles The results show that at the average particle size of 41 nm flocculation occurs and that at the average particle size of 79 nm, the sensitivity is too low (sensitivity>>250 mJ/cm$^2$). The plates with a particle size of 51 nm or 63 nm show a high sensitivity.

Example 3

Preparation of the Lithographic Substrate.

The preparation of the lithographic substrate was done according to Example 1.

Preparation of the Printing Plate Precursors 11–16.

The printing plate precursors 11 to 16 were produced by applying a coating onto the above described lithographic substrate. The composition of the coating is defined in Table 5. The coating was applied from an aqueous coating solution and a dry coating weight of 0.84 g/m$^2$ was obtained.

TABLE 5

Composition of the dry coating (% wt)

| | Styrene/ acrylonitrile copolymer (1) | IR-2 (2) | Binder (3) | Cab O Jet 200 (4) |
|---|---|---|---|---|
| Precursor 11 Comp. Ex. | 65% | 6% | 26% | 3% |
| Precursor 12 Comparative Ex. | 65% | 16% | 16% | 3% |
| Precursor 13 Invention Ex. | 75% | 16% | 6% | 3% |
| Precursor 14 Invention Ex. | 79% | 8% | 6% | 7% |
| Precursor 15 Invention Ex. | 83% | 8% | 6% | 3% |
| Precursor 16 Invention Ex. | 85% | 6% | 6% | 3% |

(1) weight ratio 60/40, stabilized with an anionic wetting agent; average particle size 52 nm, measured with a Brookhaven BI-90 analyzer, commercially available from Brookhaven Instrument Company, Holtsville, NY, USA;
(2) IR-2 as defined in Table 1;
(3) polyacrylic acid; Aquatreat AR-7H from National Starch & Chemical Company; Mw = 500 000 g/mol;
(4) Carbon dispersion in water from Cabot.

Imaging and Processing of the Printing Plate Precursors 11–16.

The plate precursors 11–16 were exposed with a Creo Trendsetter 2344T (40 W) (plate-setter available from Creo, Burnaby, Canada), operating at 260 mJ/m$^2$ and 150 rpm.

After imaging, the plates were processed in an Agfa VA88 processor, operating at a speed of 1 m/min and at 25° C., and using Agfa PD91 (trademark from Agfa) as developer solution (silicate based).

PD91 is a buffer solution comprising potassium metasilicate, Genapol C200 (surfactant commercially available from Clariant GmbH, Frankfurt am Main Germany) and Libratetic AA30 (surfactant commercially available from Libra Chemicals Limited, Manchester UK) and has a pH=13.

After development, the plates are gummed with RC795 (trademark from Agfa).

Print Results.

The plates were mounted on a GTO46 printing press (available from Heidelberger Druckmaschinen AG) and a print job was started using K+E Novavit 800 Skinnex ink (trademark of BASF Drucksysteme GmbH) and 3% FS101 (trademark from Agfa) with 10% isopropanol as a fountain liquid.

The occurrence of stain (Dmin) and toning on the non-image areas of the plate was determined and is summarized in Table 6.

TABLE 6

Stain (Dmin) and toning results

| | Dmin | Toning |
|---|---|---|
| Plate 11 (Precursor 11) Comparative Ex. | Image adhesion to substrate not sufficient (deteriorated image after processing) | |
| Plate 12 (Precursor 12) Comparative Ex. | Image adhesion to substrate not sufficient (deteriorated image after processing) | |
| Plate 13 (Precursor 13) Invention Ex. | 0.02 | No |
| Plate 14 (Precursor 14) Invention Ex. | 0.01 | No |
| Plate 15 (Precursor 15) Invention Ex. | 0.02 | No |
| Plate 16 (Precursor 16) Invention Ex. | 0.02 | No |

The results show that a latex concentration of 65% wt in the coating does not provide a good image quality. The plates with a latex concentration higher than 65% wt show no stain or toning.

Example 4

Preparation of the Lithographic Substrate.

The preparation of the lithographic substrate was done according to Example 1.

Preparation of the Printing Plate Precursors 17–20.

The printing plate precursors 17 to 20 were produced by applying a coating onto the above described lithographic substrate. The composition of the coating is defined in Table 7. The coating was applied from an aqueous coating solution and a dry coating weight of 0.84 g/m$^2$ was obtained.

TABLE 7 composition of the dry coating (% wt)

| | Styrene/ acrylonitrile copolymer (1) | IR-2 (2) | Binder (3) | Cab O jet 250 (4) |
|---|---|---|---|---|
| Plate 17 (Precursor 17) Comparative Example | 65% | 6% | 26% | 3% |
| Plate 18 (Precursor 18) Comparative Example | 65% | 16% | 16% | 3% |
| Plate 19 (Precursor 19) Invention Example | 75% | 16% | 6% | 3% |
| Plate 20 Precursor (20) Invention Example | 83% | 8% | 6% | 3% |

(1) weight ratio 60/40, stabilized with an anionic wetting agent, average particle size of 52 nm, measured with a Brookhaven BI-90 analyzer, commercially available from Brookhaven Instrument Company, Holtsville, NY, USA;
(2) Triethylammonium salt of IR-1; IR-1 as defined above;
(3) polyacrylic acid; Aquatreat AR-7H from National Starch & Chemical Company; Mw = 500 000 g/mol;
(4) Cu-Ftalocyanine-dispersion in water from Cabot.

Imaging and Processing of the Printing Plate Precursors 17–20.

The plate precursors 17–20 were exposed with a Creo Trendsetter 2344T (40 W) (plate-setter available from Creo, Burnaby, Canada), operating at 150 rpm.

After imaging, the plates were processed in an Agfa VA88 processor, operating at a speed of 1 m/min and at 25° C., and using Agfa PD91 (trademark from Agfa) as developer solution (silicate based).

PD91 is a buffer solution comprising potassium metasilicate, Genapol C200 (surfactant commercially available from Clariant GmbH, Frankfurt am Main Germany) and Libra-teric AA30 (surfactant commercially available from Libra Chemicals Limited, Manchester UK) and has a pH=13.

After development, the plates are gummed with RC795 (trademark from Agfa).

Print Results.

The plates were mounted on a GTO46 printing press (available from Heidelberger Druckmaschinen AG) and a print job was started using K+E Novavit 800 Skinnex ink (trademark of BASF Drucksysteme GmbH) and 3% FS101 (trademark from Agfa) with 10% isopropanol as a fountain liquid.

The occurrence of stain and toning on the non-image areas of the plate was determined and is summarized in Table 8.

TABLE 8

Stain (Dmin) and toning results

| | Sensitivity mJ/cm$^2$(*) | Dmin | Toning |
|---|---|---|---|
| Plate 17 (Precursor 17) | Image adhesion to substrate not sufficient (deteriorated image after processing) | | |
| Plate 18 (Precursor 18) | Image adhesion to substrate not sufficient (deteriorated image after processing) | | |
| Plate 19 (Precursor 19) | 225 | 0.02 | No |
| Plate 20 (Precursor 20) | 190 | 0.00 | No |

(*)energy at wich 2% dot is clearly reproduced on print

The data demonstrate that a latex concentration of 65% wt is not sufficient to obtain a good image quality. Plates with a latex concentration of 75% wt or 83% wt show a high sensitivity, no stain or toning.

The invention claimed is:

1. A method for making a heat-sensitive negative-working lithographic printing plate precursor comprising the steps of (i) preparing a coating solution comprising hydrophobic thermoplastic polymer particles and a hydrophilic binder;

(ii) applying said coating solution on a support having a hydrophilic surface or which is provided with a hydrophilic layer, thereby obtaining an image-recording layer; and (iii) drying said image-recording layer;

wherein said hydrophobic thermoplastic polymer particles have an average particle size in the range from 45 nmn to 63 nm, and the amount of said hydrophobic thermoplastic polymer particles in the image-recording layer is at least 70% by weight relative to the weight of the dried image-recording layer.

2. The method according to claim 1 wherein the hydrophobic thermoplastic polymer particles have an average particle size in the range from 45 nm to 55 nm.

3. The method according to claim 2, wherein the amount of hydrophobic thermoplastic polymer particles in the image-recording layer is at least 75% by weight relative to the weight of the image-recording layer.

4. The method according to claim 2, wherein the amount of hydrophobic thermoplastic polymer particles in the image-recording layer is less than or equal to 85% by weight relative to the weight of the image-recording layer.

5. The method according claim 2, wherein the hydrophobic thermoplastic polymer particles comprise polyethylene, poly(vinyl)chloride, polymethyl(meth)acrylate, polyethyl (meth)acrylate, polyvinylidene chloride, poly(meth)acrylonitrile, polyvinylcarbazole, polystyrene or copolymers thereof.

6. The method according to claim 2, wherein the hydrophilic binder is soluble in an aqueous developer having a pH≧10.

7. The method according to claim 2, wherein the image-recording layer further comprises an infrared absorbing agent in an amount of at least 6% by weight relative to the weight of the image-recording layer.

8. The method according to claim 2, wherein the coating further comprises at least one compound which provides a visible image after image-wise exposure and development.

9. The method according to claim 2, wherein the coating further comprises at least one compound which provides a visible image after image-wise exposure of the lithographic printing plate precursor but before development.

10. The method according to claim 1 wherein the amount of hydrophobic thermoplastic polymer particles in the image-recording layer is at least 75% by weight relative to the weight of the image-recording layer.

11. The method according to claim 1 wherein the amount of hydrophobic thermoplastic polymer particles in the image-recording layer is less than or equal to 85% by weight relative to the weight of the image-recording layer.

12. The method according to claim 1 wherein the hydrophobic thermoplastic polymer particles comprise polyethylene, poly(vinyl)chloride, polymethyl(meth)acrylate, polyethyl(meth)acrylate, polyvinylidene chloride, poly(meth) acrylonitrile, polyvinylcarbazole, polystyrene or copolymers thereof.

13. The method according to claim 12 wherein the hydrophobic thermoplastic polymer particles comprise polystyrene or a copolymer comprising polystyrene and poly(meth) acrylonitrile.

14. The method according to claim 1 wherein the hydrophilic binder is soluble in an aqueous developer having a pH≧10.

15. The method according to claim 1 wherein the image-recording layer further comprises an infrared absorbing agent in an amount of at least 6% by weight relative to the weight of the image-recording layer.

16. The method according to claim 1 wherein the coating further comprises at least one compound which provides a visible image after image-wise exposure and development.

17. The method according to claim 1 wherein the coating further comprises at least one compound which provides a visible image after image-wise exposure of the lithographic printing plate precursor but before development.

* * * * *